United States Patent [19]

Haley

[11] Patent Number: 5,359,768
[45] Date of Patent: Nov. 1, 1994

[54] METHOD FOR MOUNTING VERY SMALL INTEGRATED CIRCUIT PACKAGE ON PCB

[75] Inventor: Kevin J. Haley, San Jose, Calif.

[73] Assignee: Intel Corporation, Santa Clara, Calif.

[21] Appl. No.: 92,747

[22] Filed: Jul. 16, 1993

Related U.S. Application Data

[62] Division of Ser. No. 922,184, Jul. 30, 1992, abandoned.

[51] Int. Cl.⁵ .............................................. H05K 3/34
[52] U.S. Cl. ...................................... 29/840; 29/832; 29/833; 437/209
[58] Field of Search ......................... 29/840, 833, 832; 156/89; 264/61; 427/96; 437/209

[56] References Cited

U.S. PATENT DOCUMENTS

| | | | |
|---|---|---|---|
| 3,570,115 | 3/1971 | Barnes | 29/833 X |
| 4,023,198 | 5/1977 | Malone et al. | 29/840 X |
| 4,571,826 | 2/1986 | Jacobs | 29/840 |
| 4,654,966 | 4/1987 | Kohara et al. | 29/840 |
| 4,794,981 | 1/1989 | Mizuno | 29/840 X |
| 4,941,255 | 7/1990 | Bull | 29/833 |
| 4,959,900 | 10/1990 | deGivrr et al. | 29/840 |
| 5,222,014 | 6/1993 | Lin | 29/840 |

FOREIGN PATENT DOCUMENTS

| | | | |
|---|---|---|---|
| 276387 | 2/1990 | Germany | 29/840 |
| 4-124899 | 4/1992 | Japan | 29/840 |

OTHER PUBLICATIONS

IBM Tech Discl. Bull vol. 25 No. 9 Sep. 1982 pp. 1954 by J. C. Edwards.

*Primary Examiner*—Carl J. Arbes
*Attorney, Agent, or Firm*—Blakely, Sokoloff, Taylor & Zafman

[57] ABSTRACT

A very small integrated circuit package. The package of the present invention includes a substrate or die coupled to a heatsink. The substrate or die has solder bumps for being directly mounted to a circuit board. The heatsink is coupled to the die before the die is mounted to the circuit board. The heatsink is mounted using adhesive. By mounting the heatsink before the die is mounted, the heatsink may be used to handle of the substrate or die during the manufacturing and testing process, thereby increasing the reliability of the die by increased protection.

15 Claims, 1 Drawing Sheet

METHOD FOR MOUNTING VERY SMALL INTEGRATED CIRCUIT PACKAGE ON PCB

This is a divisional application Ser. No. 07/922,184, filed Jul. 30, 1992, now abandoned.

FIELD OF THE INVENTION

The present invention relates to the field of integrated circuits; more particularly, the present invention relates to an integrated circuit package that aids in the handling of a die.

BACKGROUND OF THE INVENTION

Packaging of electronic devices provides mechanical support, protection of the electronic circuitry components, and a medium for interconnecting the chip to a circuit board for use in a system. As systems become smaller, a need exists to make packages as small as possible.

The packaging process begins with the fabrication of a crystalline semiconductor material, usually silicon or gallium arsenide. Individual dies (i.e., chips) are formed on the wafer at the same time. Then the wafer is separate into single dies. One limit in making small packages is the size of the dies (e.g., the size of the silicon).

Each of the individual dies is typically packaged in a chip carrier. External connections on the chip carrier package allow for the chip to be mounted on a printed wiring board. The chip carrier is electrically connected to the printed wiring board by wire bonding leads on the chip carrier through a common mounting surface on the board or by surface mounting the chip carrier directly to the mounting surface.

One method of surface mounting is called controlled collapse chip connection (C4), or commonly referred to as flip-chip or solder bump. A flip-chip is a leadless, monolithic structure that contains circuit elements, which is designed to electrically and mechanically connect to the hybrid circuit means of an appropriate number of bumps that are located on its face and are covered with a conductive bonding agent. In other words, flip-chip is the bonding of chips face down by soldering bonding pads. Thus, flip-chip mounting is a method of mounting a silicon die or substrate without the need for subsequent wire bonding.

Initially in the flip-chip mounting process, a solder ball is formed on the top of each bonding pad. It should be noted that the bonding pads may be placed at any location on the surface of the die. A bonding-pad cap is formed over the solder balls. The die is then heated which causes the solder to recede from the surface and form a solder ball on top of the bonding-pad cap. After testing and separation of the die, each die is placed face down on a laminate substrate. The temperature is increased, which causes the solder to reflow. By reflowing the solder, the die can be bonded directly to the interconnections of the substrate. Thus, the solder balls provide both electrical connection and die attachment. It should be noted that large numbers of bonds may be formed in this manner simultaneously.

In the mounting process, after the solder bumps have been placed on the die, the wafer containing the die is cut to form the individual dies. Some electrical testing is then performed on the chip. The chip is then placed in the system. A heatsink or other apparatus is then attached to the chip to dissipate heat during its operation. The size of the package is limited by its capacity to dissipate heat out from the die.

If after placement in the system, the die is not fully functional, then it must be removed from the system, and then the process is repeated. The die may not be fully functional because of a handling error which occurred in the manufacturing process. Other problems may arise during the burning-in of a bare die, in the handling of the bare die, in the manufacturing of the bare die or when the die is dissipating heat. Thus, there is a need to assure reliability in the package.

As will be shown, the present invention is an integrated circuit package that is very small. Furthermore, the package of the present invention offers a means of handling the package during the manufacturing process. Also the package of the present invention increases the reliability of the die.

SUMMARY OF THE INVENTION

It is an object of the present invention to provide a very small integrated circuit package.

It is another object of the present invention to provide an integrated circuit package that protects the die while handling the die during manufacturing.

It is yet another object of the present invention to provide an integrated circuit package that permits probing of the die during test.

It is still another object of the present invention to provide an integrated circuit package which provides some environmental protection from humidity and corrosion of the die.

These and other objects of the present invention are provided by an integrated circuit package which includes a die (or substrate) coupled to a heatsink. The die has solder bumps for directly mounting it to a circuit board. The heatsink is coupled to the die before the die is mounted to the circuit board. The heatsink is mounted using adhesive. By mounting the heatsink before the die is mounted, the heatsink may be used to handle the die during the manufacturing and testing process, thereby increasing the reliability of the die by increased protection.

BRIEF DESCRIPTION OF DRAWINGS

The present invention will be understood more fully from the detailed description given below and from the accompanying drawings of the preferred embodiment of the invention, which, however, should not be taken to limit the invention to the specific embodiments, but are for explanation and understanding only.

DETAILED DESCRIPTION OF THE INVENTION

Figure 1:
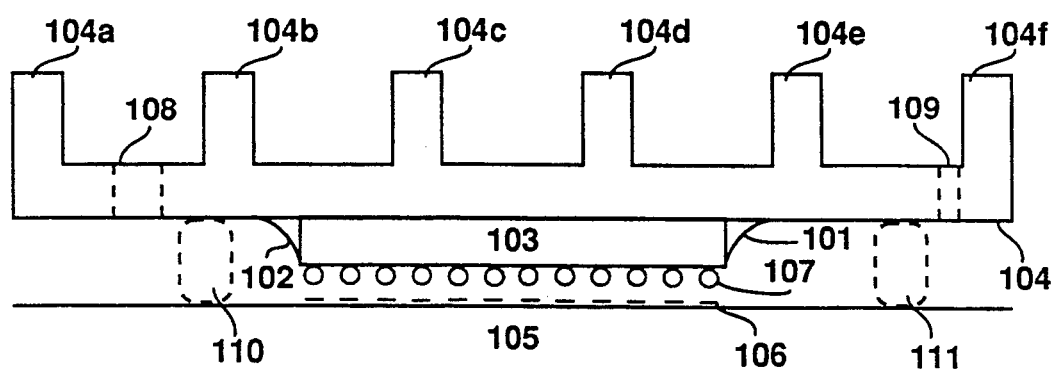
FIG. 1 illustrates one embodiment of the package of the present invention.

A very small integrated circuit package is described. In the following description, numerous specific details are set forth, such as specific numbers of solder bumps, heatsink flanges, etc., in order to provide a thorough understanding of the preferred embodiment of the present invention. It will be obvious to those skilled in the art that the present invention may be practiced without these specific details.

FIG. 1 illustrates one embodiment of the package of the present invention. Referring to FIG. 1, die 103 is shown coupled to heatsink 104 using adhesive 101 and 102. Die 103 is upside down and has multiple solder bumps 107 on its top side facing contacts 106 on circuit board 105, such that the package is to be mounted as a flip-chip. It should be noted that in the following discussion the term die may be used interchangeably with substrate or chip.

Heatsink 104 dissipates heat from the die. Heatsink 104 comprises a small plate coupled to the back of the die. In the currently preferred embodiment, the plate is metal. Heatsink 104 is sized according to the power dissipation requirements of the die and end system, i.e., the amount of heat that needs to be transferred from the die. In one embodiment, the plate is twice as large linearly as the die. As shown, heatsink 104 has six flanges 104a-f which protrude upward from the flat portion of the plate. It should be noted, however, that heatsink 104 could have any shape (e.g., flat) or structure which is capable of dissipating heat from the die.

It should be noted that heatsink 104 is mounted to substrate 103 before the attaching of substrate 103 to circuit board 105. In the prior art, heatsinks are not attached until after the die or substrate is attached to the circuit board. Heatsink 104 aids in the handling and locating of the die during the attachment of the die to circuit board 105. Because great accuracy is required to match the solder bumps 107 with the pads 106 on the board, heatsink 104 provides tooling holes 108 and 109. Although two tooling holes are shown in FIG. 1, optical alignment marks may be used. Furthermore, it should be noted that any number of tooling holes or optical alignment marks may be used, including one. The number of tooling marks actually utilized is dependent on the specific manufacturing process and machinery used in the tooling of the die. Provided that the hole sizes and tolerances for the individual heatsink allow, the tooling holes permit the die to be precisely located on circuit board 105 (i.e., optical alignment). Tooling hole 108 allows for viewing of the die to locate the top and the bottom of the die for placement upon circuit board 105. If tooling marks were utilized, then mechanical alignment can be utilized to locate the die on circuit board 105.

During manufacturing, heatsink 104 acts as carrier for die 103, such that die 103 does not have to be held by itself. Thus, during testing, inspecting, burning-in and marking of the chip, the size scale of what is being held is increased. Heatsink 104 offers a support surface to set the die on during the manufacturing process, such that the die does not come in contact with another surface. By allowing the package to be placed on the side having the heatsink the solder balls attached to the die are protected from damage, such as being knocked off or being shorted with another solder bump, and are protected from contamination. Thus, attaching heatsink 104 before completion provides a means for setting die 103 above the ground while the manufacturing process continues.

To couple heatsink 104 to die 103, an adhesive is utilized. There are many adhesives known in the art which may be used. In the currently preferred embodiment, the adhesive is epoxy. It should be noted that the attachment of heatsink 104 to die 103 using the adhesive can be accomplished while performing the reflow connecting process for solder bumps 107 to circuit board 105.

The connection of die 103 to circuit board 105 is made when solder bumps 107 are coupled to bonding pads 106. In the currently preferred embodiment, solder bumps 107 comprise a solder compound of tin and lead. In one embodiment, the solder connection between circuit board 105 and die 103 is made by heating the chip to reflow the solder. In another embodiment, the connection is made using a shrinking adhesive placed between heatsink 104 and circuit board 105. The shrinking adhesive produces a pressure connection by forcing the solder balls 107 onto pads 106. In the currently preferred embodiment, the shrinking adhesive is placed under the portion of heatsink 104 which extends past the sides of die 103 at locations 110 and 111 in FIG. 1. Furthermore, in the currently preferred embodiment, the shrinking adhesives 110 and 111 are an epoxy type of adhesive. The shrinking adhesive is such that the shrinking of the adhesive creates enough pressure to form the pressure connection.

The use of the shrinking adhesive provides a means of shielding the chip connection from the environment, thereby providing better reliability. Using the shrinking adhesive also provides additional stress relief. For instance, when circuit board 105 flexes, the stress travels through the solder joints. The seal from the shrinking adhesive enables the release of some of the stress, such that the connection is better able to withstand the stress.

In the currently preferred embodiment, solder bumps 107 are placed along the outer edge of die 103. Die 103 has pads all over its top portion, thereby causing the pitch to be small. The pads may be placed all over the active circuitry in die 103 because the fastening of the solder does not apply any force on the active circuitry. Thus, if the reflow method is used to produce the connection between die 103 and circuit board 105, the pads may be placed all over the surface of the die. However, if a shrinking adhesive is used to make the connection, solder bumps 107 are not be placed on the active circuitry if the resulting pressure connection would create damage. However, even though solder bumps 107 are not placed on the active circuitry of die 103, a pitch of 25 mils can still be attained.

Whereas many alterations upon applications of the present invention will no doubt become apparent to a person of ordinary skill in the art after having read the foregoing description, it is understood that the particular embodiment shown and described by illustration is in no way intended to be limiting. Therefore, reference to details of the preferred embodiments are not intended to limit the scope of the claims which themselves recite only those features regarded as essential to the invention.

Thus, an integrated circuit package and method for producing the integrated circuit package have been described.

I claim:

1. A method for mounting an integrated circuit package having a die to a circuit board comprising the steps of:
   mounting a heat sink directly to the back of the die to create the integrated circuit package, wherein said die is handled during manufacturing using said heat sink; and then
   coupling the die to the circuit board at the same time as the heat sink is mounted to the back of the circuit board, wherein the integrated circuit package becomes electrically connected to the circuit board, such that the die is sealed from an ambient environment.

2. The method as defined in claim 1 wherein said heat sink is mounted to the back of the die using adhesive.

3. The method as defined in claim 1 wherein the heat sink is mounted to said circuit board using a shrinking adhesive, such that the electrical connection is made between the die and the circuit board due to the effect produced by the adhesive shrinking.

4. The method as defined in claim 4 wherein the heat sink is mounted to said circuit board by reflowing the solder bumps.

5. The method as defined in claim 1 wherein said heat sink comprises a metal.

6. A method for coupling an integrated circuit package having a die to a circuit board comprising the steps of:
mounting a heat sink directly to the back of the die to form the integrated circuit package;
handling the die using the heat sink, wherein the heat sink acts as a carrier for the die during testing, inspecting and burning-in of the die and wherein the step of handling further includes die onto the circuit board using the heat sink; and
mounting the die to the circuit board wherein the integrated circuit package is electrically connected to the circuit board.

7. A method defined in claim 6 wherein the sink includes an alignment means and wherein the method further comprises the steps of locating the die on the circuit board using the alignment means of the heat sink.

8. A method defined in claim 7 wherein the alignment means includes at least one tooling hole, such that the die is located on the circuit board using said at least one tooling hole.

9. The method defined in claim 7 wherein the alignment means includes at least one optical alignment mark, such that the die is located on the circuit board using said at least one optical alignment mark.

10. The method defined in claim 6 wherein a plurality of solder bumps are coupled to the die and a portion of the heat sink extends past the end of the die and the circuit board including a plurality of pads positioned for coupling to the plurality of solder bumps and further wherein the step of mounting the die comprises the steps of:

placing shrinking adhesive between the portion of the heat sink that extends past the die and the circuit board; and
creating a pressure connection between the die and the circuit board when the shrinking adhesive shrinks to couple the heat sink to the circuit board, such that the solder bumps on the die are forced into an electrical connection with the plurality of pads on the circuit board.

11. A method of mounting an integrated circuit die onto a circuit board having a plurality of bonding pads, said method comprising the steps of:
mounting a heat sink directly to the back of the die using adhesive to produce an integrated circuit package;
handling the die using the heat sink, wherein the heat sink carrier for the die during testing, inspecting and burning-in of the die on wherein the step of handling further includes; locating the die on the circuit board using an alignment means of the heat sink;
placing shrinking adhesive between a portion of the die that extends past the die and the circuit board; and
creating a pressure connection between the die and the circuit board when the shrinking adhesive shrinks to couple the heat sink to the circuit board, such that the solder bumps are forced into an electrical connection with the plurality of bonding pads on the circuit boards.

12. The method defined in claim 11 wherein the heat sink is mounted to the back of the die using adhesive.

13. The method defined in claim 11 wherein the heat sink is mounted to the circuit board using a shrinking adhesive, such that the electrical connection is made between the die and the circuit board due to the adhesive shrinking to couple the heat sink to the circuit board.

14. The method defined in claim 11 wherein the heat sink is mounted to the circuit board by reflowing the solder bumps.

15. The method defined in claim 11 wherein the heat sink comprises metal.

* * * * *

UNITED STATES PATENT AND TRADEMARK OFFICE
CERTIFICATE OF CORRECTION

PATENT NO. : 5,359,768
DATED : November 1, 1994
INVENTOR(S) : Kevin J. Haley It is certified that error appears in the above-identified patent and that said Letters Patent is hereby corrected as shown below:

In column 5 at line 4 delete "claim 4" and insert --claim 1--

In column 5 at line 19 insert --placing the-- following "includes" and prior to "die"

In column 5 at line 24 insert --heat-- following "the" and prior to "sink"

In column 6 at line 17 insert --acts as a-- following "sink" and prior to "carrier"

In column 6 at line 18 delete "on" and insert --and--

Signed and Sealed this

Twenty-ninth Day of April, 1997

*Attest:*

BRUCE LEHMAN

*Attesting Officer*  Commissioner of Patents and Trademarks